(12) United States Patent
Adachi et al.

(10) Patent No.: US 7,666,793 B2
(45) Date of Patent: Feb. 23, 2010

(54) METHOD OF MANUFACTURING AMORPHOUS METAL OXIDE FILM AND METHODS OF MANUFACTURING CAPACITANCE ELEMENT HAVING AMORPHOUS METAL OXIDE FILM AND SEMICONDUCTOR DEVICE

(75) Inventors: Kiwamu Adachi, Kanagawa (JP); Satoshi Horiuchi, Kanagawa (JP); Tetsuya Yukimoto, Chiba (JP)

(73) Assignees: Sony Corporation, Tokyo (JP); CV Research Corporation, Tokyo (JP)

( * ) Notice: Subject to any disclaimer, the term of this patent is extended or adjusted under 35 U.S.C. 154(b) by 632 days.

(21) Appl. No.: 10/998,759

(22) Filed: Nov. 30, 2004

(65) Prior Publication Data
US 2005/0095850 A1 May 5, 2005

Related U.S. Application Data

(63) Continuation of application No. 10/395,389, filed on Mar. 25, 2003, now Pat. No. 6,916,747.

(30) Foreign Application Priority Data
Mar. 26, 2002 (JP) ............ P2002-086535
Mar. 26, 2002 (JP) ............ P2002-086553

(51) Int. Cl.
*H01L 21/00* (2006.01)
(52) U.S. Cl. ................. 438/710; 438/709
(58) Field of Classification Search ........... 438/709, 438/710
See application file for complete search history.

(56) References Cited

U.S. PATENT DOCUMENTS 6,204,203 B1    3/2001  Narwankar et al.
6,355,516 B1    3/2002  Kim et al.
6,916,747 B2 *  7/2005  Adachi et al. ............... 438/709
2003/0184205 A1  10/2003  Johnson

FOREIGN PATENT DOCUMENTS

JP    07-066369    3/1995
JP    07-335565    12/1995

(Continued)

OTHER PUBLICATIONS

Japanese Office Action 2002-086553; Issued on Dec. 19, 2006; 7 pages.
JPO Office Action dated Jun. 13, 2006.

*Primary Examiner*—Fernando L Toledo
(74) *Attorney, Agent, or Firm*—Rader, Fishman & Grauer PLLC

(57) ABSTRACT

A film deposition process for depositing an amorphous metal oxide film, for example, an amorphous tantalum oxide film and a film treatment process for improving film quality of the amorphous tantalum oxide film in the state in which an amorphous state of the amorphous metal oxide film is being maintained by a high-density plasma radiation treatment based upon ion and radical reactions and which contains at least oxygen at an ion current density higher than 5 $mA/cm^2$ are carried out, whereby a low-temperature treatment in the whole process is made possible. In addition, since the amorphous metal oxide film, which is excellent in film quality, can be deposited, the amorphous metal oxide film can be made high in reliability and can be produced inexpensively. The amorphous tantalum oxide film which is excellent in film quality can be manufactured inexpensively by a low-temperature treatment. Also, when a capacitance element having an amorphous metal oxide film and a semiconductor device are manufactured, the amorphous metal oxide film which is excellent in film quality can be deposited by a low-temperature treatment and highly-reliable capacitance element and semiconductor device can be manufactured.

17 Claims, 7 Drawing Sheets

FOREIGN PATENT DOCUMENTS

| | | |
|---|---|---|
| JP | 08-069972 A | 3/1996 |
| JP | 09-055376 | 2/1997 |
| JP | 09-205143 A | 8/1997 |
| JP | 09-246379 A | 9/1997 |
| JP | 11-074478 | 3/1999 |
| JP | 2000-058789 A | 2/2000 |
| JP | 2001-073146 A | 3/2001 |
| JP | 2001-148377 A | 5/2001 |
| JP | 2002-050622 A | 2/2002 |
| WO | WO 01/69665 A1 | 9/2001 |

* cited by examiner

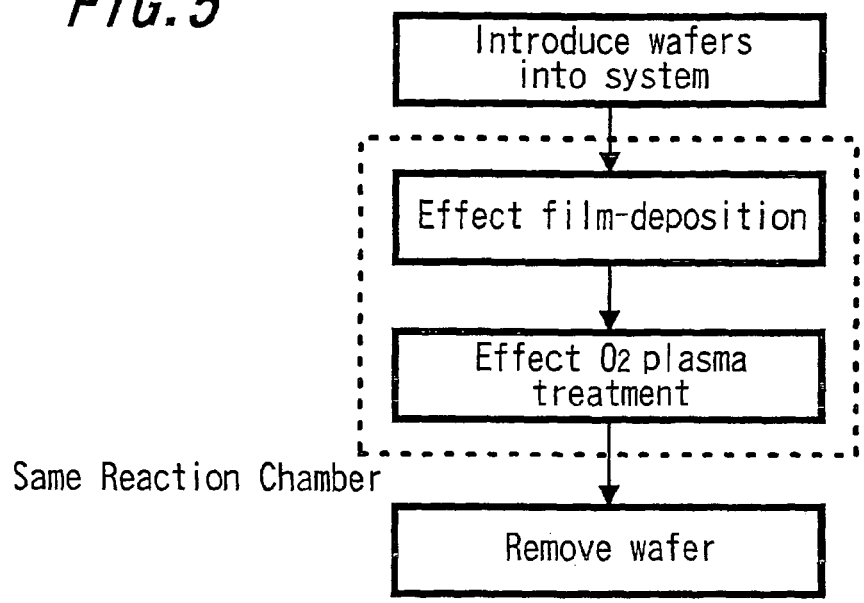
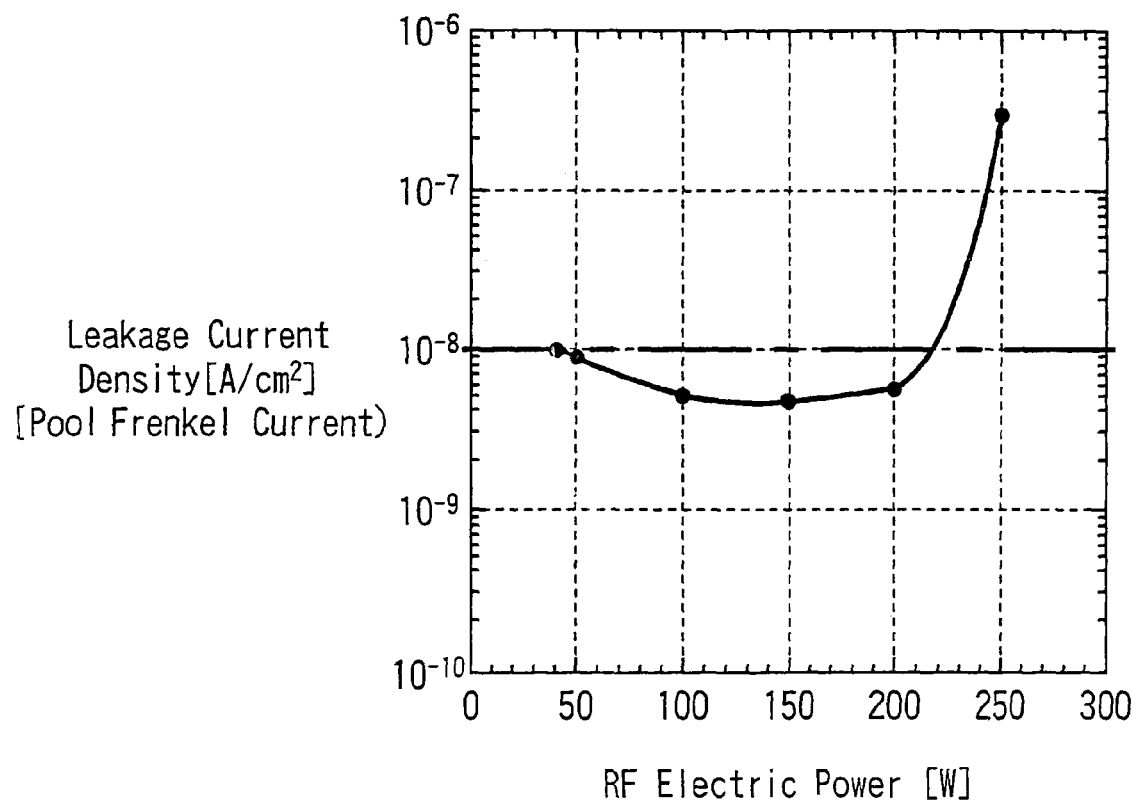

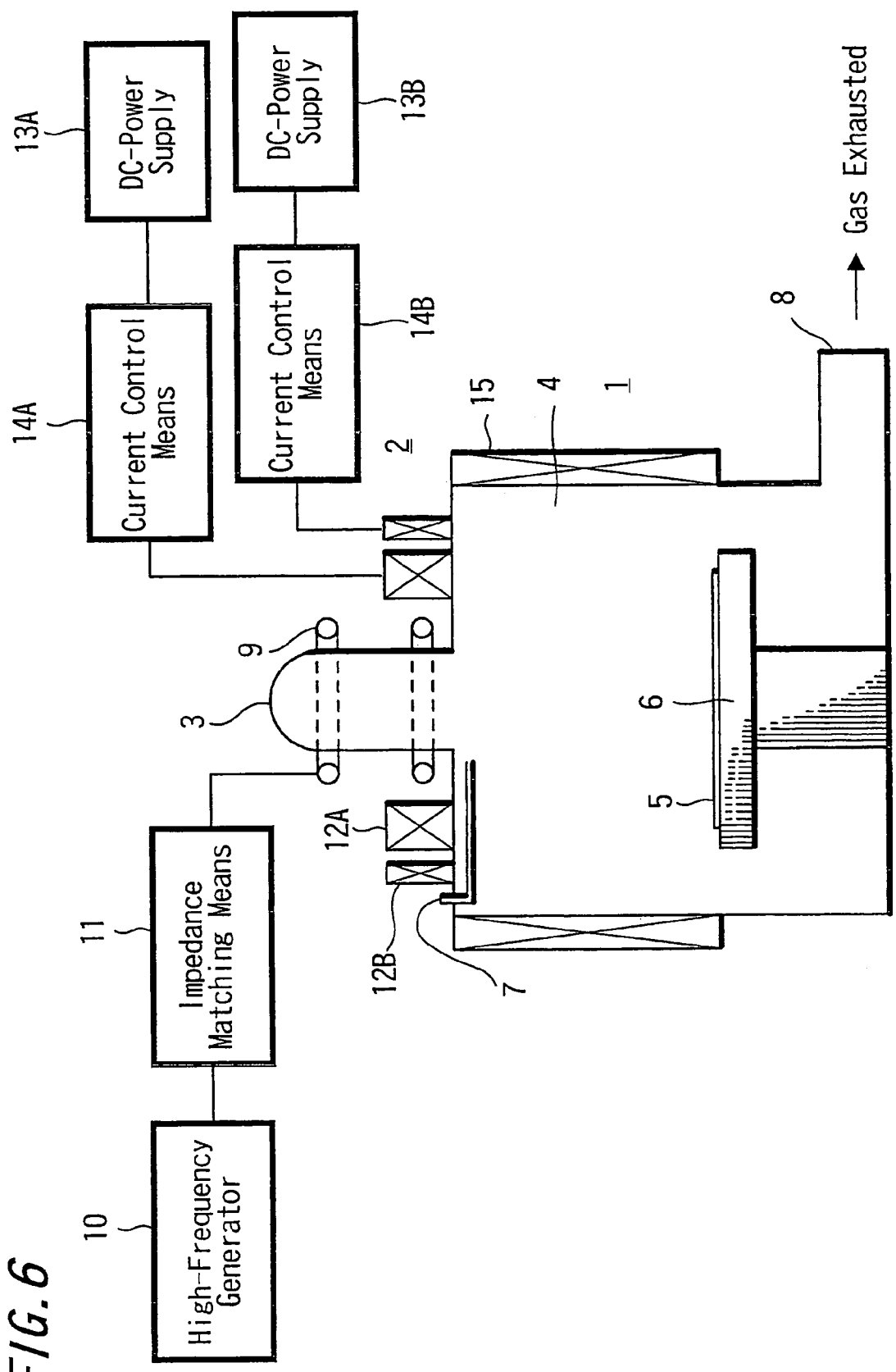

METHOD OF MANUFACTURING AMORPHOUS METAL OXIDE FILM AND METHODS OF MANUFACTURING CAPACITANCE ELEMENT HAVING AMORPHOUS METAL OXIDE FILM AND SEMICONDUCTOR DEVICE

CROSS REFERENCE TO RELATED APPLICATIONS

The present application is a Continuation Application of the patent application Ser. No. 10/395,389, filed on Mar. 25, 2003 now U.S. Pat. No. 6,916,747, the entire contents of which are incorporated herein by reference.

BACKGROUND OF THE INVENTION

1. Field of the Invention

The present invention relates to a method of manufacturing amorphous metal oxide films and methods of manufacturing a capacitance element having an amorphous metal oxide film and a semiconductor device having an amorphous metal oxide film, e.g., methods of manufacturing an electrostatic capacitance element using an amorphous metal oxide film formed of an amorphous tantalum oxide thin film as a dielectric insulation film, e.g., a semiconductor device including an amorphous tantalum oxide thin film.

2. Description of the Related Art

Semiconductor devices, e.g., semiconductor integrated circuit devices, generally use a nitride silicon film ($Si_3N_4$ film) as a capacitive insulation film of an electrostatic capacitance element. As demand for the microminiaturization of semiconductor devices and the demands for increased degrees of integration and increased operation speeds for semiconductor devices progressively increase, various studies and developments for depositing $Al_2O_3$ films, oxide tantalum films, BaSrTiO films, SrTao films and $PbTiO_3$—$PbZrO_3$ films have been made so far. Of these metal films, tantalum oxide films have received remarkable attention. When a capacitance element having an MIS (metal-insulator-semiconductor) structure is formed, the following method is now frequently used to deposit a tantalum oxide film of its capacitive insulation layer, for example. FIG. 1 is a schematic flowchart to which reference will be made in explaining a method of depositing a tantalum oxide film. As shown in FIG. 1, a substrate, e.g., a semiconductor wafer, is introduced into a low-pressure CVD (chemical vapor deposition) method system at a step S1, whereafter a tantalum oxide film is deposited at a step S2. In general, when most of the tantalum oxide film is deposited, pentaethoxytantalum ($Ta(OC_2H_5)_5$) is used as a raw material, vaporized and then reacted with oxygen at a heat energy of about 450° C. under reduced pressure.

However, according to this film deposition method, a large amount of carbon (C) and hydroxyl group remains in the deposited film. Moreover, there is deposited a film which is in short of oxygen so that Ta and O cannot be coupled sufficiently.

As a result, only by this deposited film, there cannot be obtained sufficient electric characteristics, in particular, a leakage current characteristic, a withstand voltage characteristics, a dielectric constant and so forth.

To solve these problems, it is necessary to carry out a film quality improvement treatment. In this film quality improvement treatment, the deposited film is conveyed from the above-mentioned low-pressure CVD system into a film quality improvement system, e.g., an ultraviolet-ray radiation anneal treatment (so-called UV-$O_3$ treatment) system, at a temperature ranging from 400° C. to 500° C. in the atmosphere of ozone at a step S3, wherein the deposited film is annealed at a step S4. Then, the wafer thus annealed is taken out from this treatment system at a step S5 and is then further annealed at a temperature in excess of 600° C. in an atmosphere of oxygen at a step S6.

The above-mentioned film is deposited by a general multi-chamber CVD system. FIG. 2 is a diagram showing a schematic arrangement of such a multi-chamber CVD system. As shown in FIG. 2, this multi-chamber CVD system includes four chambers 101a to 101d at maximum prepared for a substrate, for example, a wafer conveying chamber in which a substrate or wafer is deposited. The substrate is transported from substrate cassette load-lock chambers 102 by a transportation robot 103 into the respective chambers 101a to 101d and vice versa.

Then, in this system, the two chambers are configured as film-deposition chambers and the remaining two chambers are configured as UV-$O_3$ chambers serving as chambers in which wafers are treated after oxidation. A tantalum oxide film is deposited by any one of the film-deposition chambers and is treated by a post-treatment process in any one of the UV-$O_3$ chambers.

The tantalum oxide film thus treated by the post-treatment process is then annealed at a temperature higher than 600° C. in the oxygen atmosphere containing at least oxygen and thereby can be improved in quality.

However, in recent years, semiconductor devices have been required to operate at higher speeds. Hence, there is a trend that necessary layers such as electrode layers and interconnection layers should be formed of metal layers progressively. In accordance with the above-mentioned increasing demands and trends, in the semiconductor device manufacturing process, it is requested that a heat-treatment process be made at lower temperatures. For example, there is an increasing demand that a capacitance element serving as a circuit element in a semiconductor integrated circuit introduce a so-called MIM (metal-insulator-metal) structure obtained when an electrode layer or an interconnection layer is formed of a metal layer.

When the capacitance element having the MIM structure or the like is formed under the above-mentioned circumstances, if a metal oxide film such as a tantalum oxide film is formed as a dielectric insulation layer by the above-mentioned film-deposition method which requires the above-mentioned high-temperature treatment, then problems will arise in the characteristics and reliability of the capacitance element, i.e., the semiconductor device.

Specifically, in the stage in which the metal film that requires the above-mentioned high-temperature treatment is formed, when the metal layer has already been existing, i.e., a metal layer has a structure in which an electrode metal layer of a lower layer has already been existing in the MIM structure, this metal layer has to be formed of high-melting point metals which are rich in heat-resisting properties and which are low in resistivity, e.g., expensive metals such as Pt (platinum) and Ru (ruthenium). However, these metals inevitably encounter poor workability obtained when these metals are formed as microminiaturized patterns. Moreover, it is unavoidable that these metals require complex manufacturing processes and complex manufacturing facilities, such that the metal layers become expensive.

On the other hand, as a substitute technology for the above-mentioned post-treatment with high temperature, there has been examined so far a method in which a metal layer is processed by an $O_2$ plasma oxidation treatment after the metal layer had been deposited. FIG. 3 is a flowchart to which reference will be made in explaining the above-mentioned substitute technology. As shown in FIG. 3, a substrate, e.g., a semiconductor wafer, is introduced into a low-pressure CVD method system at a step S10, whereafter a tantalum oxide film is deposited on the semiconductor wafer at a step S11. Then, the deposited film is transported from the above-mentioned low-pressure CVD system into the film quality improvement system, e.g., ultraviolet-ray radiation anneal treatment system, at a temperature ranging from 400° C. to 500° C. in the atmosphere of ozone at a step S12, wherein the deposited film is processed by an $O_2$ plasma treatment at a step S13. Then, the semiconductor wafer thus processed by the $O_2$ plasma treatment is taken out from this treatment system at a step S14. However, a plasma oxidation treatment executed by a general diode parallel plate plasma treatment system fails to provide sufficiently high film characteristics.

Furthermore, in this case, it is necessary to prepare both a CVD system for depositing films and a high-density plasma system. Even when these systems are formed as a single system, it is unavoidable that metal layers should be produced expensively.

SUMMARY OF THE INVENTION

In view of the aforesaid aspects, it is an object of the present invention to provide methods of depositing an amorphous tantalum oxide film, i.e., and amorphous metal oxide film, excellent in quality as a dielectric insulation film by a low-temperature treatment and which can manufacture a capacitance element and a semiconductor device inexpensively.

In a method of manufacturing an amorphous metal oxide film and a capacitance element, according to an aspect of the present invention, there is provided a method of manufacturing a capacitance element using an amorphous metal oxide film and an amorphous metal oxide film as a capacitance insulation film. This manufacturing method comprises a process for depositing an amorphous metal oxide film and a film quality improvement treatment process for improving the film quality of the amorphous metal oxide film in the state in which an amorphous state of the amorphous metal oxide film is maintained by a high-density plasma radiation treatment based upon ion and radical reactions and which contains at least oxygen at an ion current density higher than 5 mA/cm$^2$.

According to another aspect of the present invention, there is provided a method of manufacturing a semiconductor device including an amorphous metal oxide film which comprises a process for depositing an amorphous metal oxide film and a film quality improvement treatment process for improving the film quality of the amorphous metal oxide film in the state in which an amorphous state of the amorphous metal oxide film is maintained by a high-density plasma radiation treatment based upon ion and radical reactions and which contains at least oxygen at an ion current density higher than 5 mA/cm$^2$.

In the methods of manufacturing the capacitance element and the semiconductor device according to the present invention, all treatments, including the treatment for depositing the amorphous metal oxide film, can be carried out at low temperature, to be concrete, at a temperature lower than 430° C. As a result, it becomes possible to use a low melting-point metal layer having low resistivity and which is excellent in workability as a low layer electrode, an interconnection layer and the like.

According to the manufacturing methods of the present invention, since the film-deposition process and the film quality improvement treatment can be carried out within the same reaction chamber, the system can be simplified in arrangement and its workability can be improved.

BRIEF DESCRIPTION OF THE DRAWINGS

FIG. 5 is a flowchart to which reference will be made in explaining another example of a method for depositing an amorphous tantalum oxide thin film according to the present invention;

FIG. 6 is a schematic diagram showing an arrangement of a helicon plasma system that is used in a manufacturing method according to the present invention;

FIG. 7 is a characteristic graph showing the dependence of leakage current density relative to RF electric power and to which reference will be made in explaining a manufacturing method according to the present invention;

DESCRIPTION OF THE RPEFERRED EMBODIMENTS

The present invention will now be described with reference to the accompanying drawings.

Figure 1:
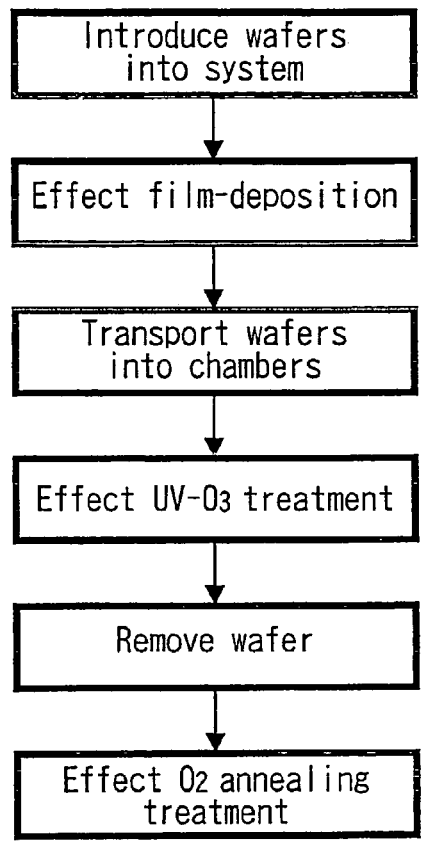
FIG. 1 is a flowchart to which reference will be made in explaining a method of depositing a tantalum oxide film of a capacitance insulation layer according to the related art.
Figure 2:
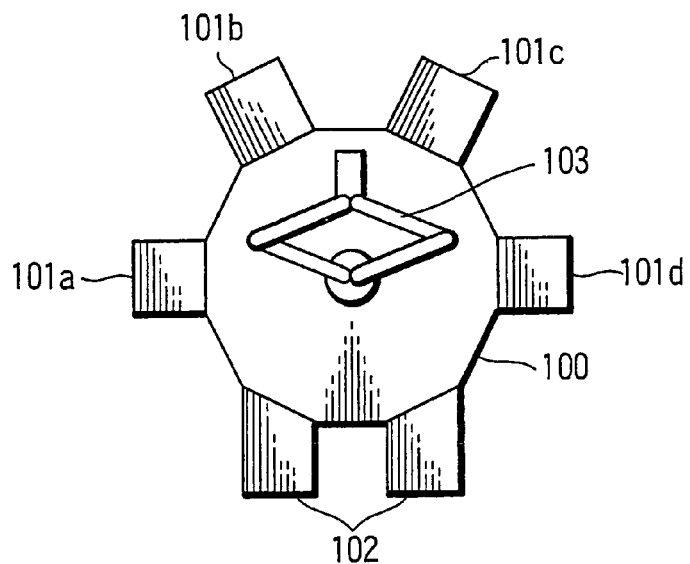
FIG. 2 is a schematic diagram showing an arrangement of a general multi-chamber CVD system used in the related art.
Figure 3:
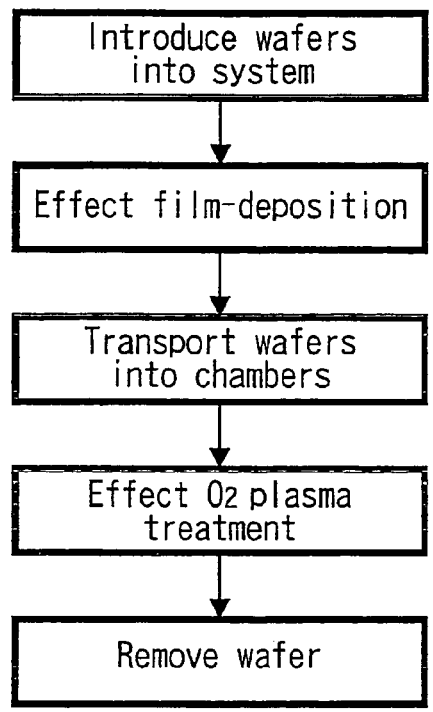
FIG. 3 is a flowchart to which reference will be made in explaining a substitute technology serving as a post-treatment method with high temperature for depositing a tantalum oxide film according to the related art.
Figure 4:
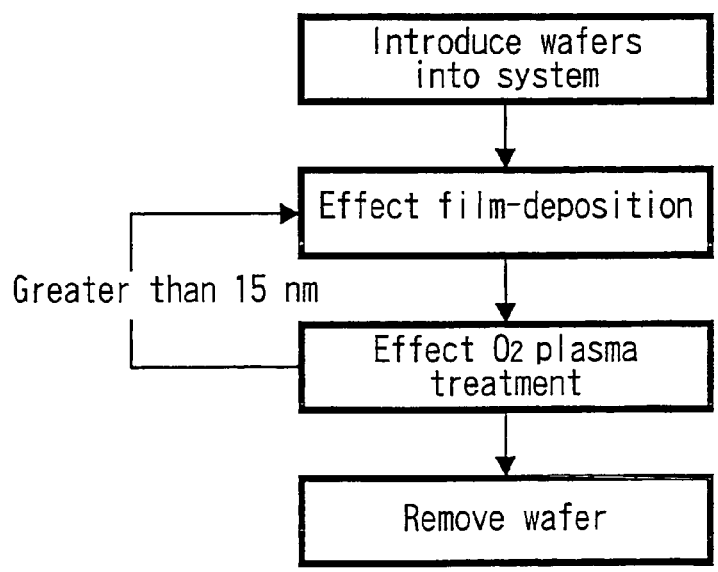
FIG. 4 is a flowchart to which reference will be made in explaining an example of a method for depositing an amorphous tantalum oxide thin film according to the present invention.

First, methods of manufacturing an amorphous metal oxide film, a capacitance element having an amorphous metal oxide film and a semiconductor device according to the present invention will be described with reference to FIG. 4. FIG. 4 is a flowchart to which reference will be made in explaining a process for manufacturing an amorphous metal oxide film, e.g., amorphous tantalum oxide film, according to the present invention. As shown in FIG. 4, a substrate on which this amorphous tantalum oxide film is deposited, e.g., a silicon semiconductor wafer is introduced into an amorphous tantalum oxide film film-deposition system at a step S20, whereafter an amorphous tantalum oxide film is deposited on the silicon semiconductor wafer at a step S21.

At the next step S22, a quality improvement treatment for improving the film quality of an amorphous tantalum oxide thin film is effected by an oxygen plasma treatment in the state in which the amorphous state of the amorphous tantalum oxide thin film is maintained by a high-density plasma radiation treatment based upon ion and radical reactions and which contains at least oxygen (O) atoms at ion current density higher than 5 mA/cm$^2$, e.g., a helicon plasma radiation treatment.

A process for depositing an amorphous oxide metal thin film, e.g., a amorphous tantalum oxide thin film, may be replaced with a film-deposition process mainly composed of a radical reaction using the above-mentioned high-density plasma source; and plasma electric power in this film-deposition process may be selected to be greater than 40 W and smaller than 200 W.

Plasma electric power in the film quality improvement treatment process may be selected to be greater than 500 W and smaller than 2000 W.

When a target film thickness of the amorphous metal oxide film is greater than 15 nm, for example, as shown in FIG. 4, the film-deposition process and the succeeding film quality improvement treatment process are repeated, and respective films having a film thickness of less than 15 nm are deposited so that a total film thickness of the amorphous metal oxide film may become equal to a target film thickness larger than 15 nm. Then, the wafer thus produced is taken out from the above-mentioned system at a step S23.

FIG. 5 is a flowchart to which reference will be made in explaining another example of a method of depositing the amorphous tantalum oxide thin film according to the present invention. In FIG. 5, steps identical to those of FIG. 4 are marked by the same identical reference numerals and therefore need not be described in detail. As shown in FIG. 5, the film-deposition process and the film quality improvement treatment process for the above-mentioned amorphous metal oxide film can be carried out by the same reaction chamber that is designated by reference numeral 200.

Moreover, both the film-deposition process and the film quality improvement treatment process for the above-mentioned amorphous metal oxide film should be carried out at a temperature of less than 430° C.

A method of manufacturing a capacitance element according to the present invention is a capacitance element manufacturing method in which a dielectric insulation layer is composed of an amorphous metal oxide film. Specifically, the dielectric insulation layer is formed by the above-mentioned method of manufacturing the amorphous metal oxide film according to the present invention.

Further, a method of manufacturing a semiconductor device according to the present invention is a method of manufacturing a semiconductor device including an amorphous metal oxide film. Specifically, the amorphous metal oxide film is formed by the above-mentioned method of manufacturing the amorphous metal oxide film according to the present invention.

First, a helicon plasma treatment system serving as a plasma treatment system using a high-density plasma source for use in effecting a manufacturing method according to the present invention will be described with reference to FIG. 6.

FIG. 6 is a schematic diagram showing an arrangement of a helicon plasma treatment system. As shown in FIG. 6, this helicon plasma treatment system, generally depicted by reference numeral 1, includes a helicon plasma generation source 2 and a reaction chamber 4 which communicates with a quartz belljar 3 in which plasma is generated.

Within this reaction chamber 4, there is disposed a susceptor 6 including a heater (not shown) for heating a film-deposited substrate 5 such as a semiconductor wafer, disposed therein, at a predetermined temperature.

The reaction chamber 4 includes a gas introducing inlet 7 for introducing process gas and an exhaustion outlet 8 for exhausting process gas by an exhaustion pump (not shown) in such a manner that the degree of vacuum within the reaction chamber 4 is adjusted to a predetermined one by a pressure regulator (not shown).

In the plasma generation source 2, a helicon antenna 9 is disposed around the outer periphery of the belljar 3 and RF electric power of 13.56 MHz is applied from a high-frequency (RF) generator 10 to the helicon antenna 9 through an impedance matching means 11.

An inside coil 12A and an outside coil 12B are wound around the nearby portion of the belljar 3. Direct currents (DC) flowing in directions opposite to each other are supplied to these inside and outside coils 12A and 12B from DC power-supplies 13A and 13B through current control means 14A and 14B to thereby form magnetic fields. By adjusting these current values and the ratio between these current values, helicon waves are propagated to draw plasma from the belljar 3. At the same time, the homogeneity of plasma is adjusted near the substrate 5 by an interaction between helicon waves thus drawn and magnetic fields generated from a magnetic field generation means 15 formed of a permanent magnet or an electromagnet disposed at the side surface of the reaction chamber 4.

According to the plasma treatment system 1 having the above-mentioned arrangement, the film-deposition treatment and the oxidation treatment are carried out by properly varying the kind of supplied gas.

Next, although inventive examples for effecting the manufacturing method according to the present invention by using the above-mentioned plasma treatment system 1 will be described, the present invention may not of course be limited to the following inventive examples.

FIRST INVENTIVE EXAMPLE

In this inventive example, an amorphous tantalum oxide film is deposited. First, the RF power was selected to be less than 200 W and the film-deposition treatment process was executed in the area mainly composed of radical reaction without aggressively using propagation of helicon waves.

Next, oxidation gas containing oxygen such as oxygen gas was supplied from the gas introducing inlet 7, and an ion and radical mixture high-density plasma atmosphere which aggressively uses helicon propagation in which RF power falls within a range of from 500 W to 2000 W was generated. Under this atmosphere, the amorphous tantalum oxide film that had been deposited previously was oxidized in the state in which its amorphous state was being maintained. In that manner, the film quality improvement treatment process that had been made insufficient by the film-deposition process was carried out.

At that time, when the plasma electric power required in the film-deposition process, i.e., the RF electric power, was selected to be less than 200 W, an amorphous film, i.e., an amorphous film in which very small crystals were not generated, could be deposited. Then, it was confirmed that when the RF electric power was selected to be higher than 200 W, very small crystals were generated during the film-deposition so that it became difficult to deposit a perfect amorphous film. Further, it was confirmed that when the RF electric power was selected to be less than 40 W, stable plasma discharge could not be obtained so that an amorphous film could not be deposited stably. Specifically, plasma electric power required in the film-deposition process should be selected to be higher than 40 W and less than 200 W.

FIG. 7 is a characteristic graph showing the measured results of the dependence of leakage current densities obtained when the RF electric power was changed. From this characteristic graph shown in FIG. 7, it is to be understood that deposited films in which the leakage current density was low at the RF electric power ranging from 200 W to 40 W could be obtained.

Figure 8:
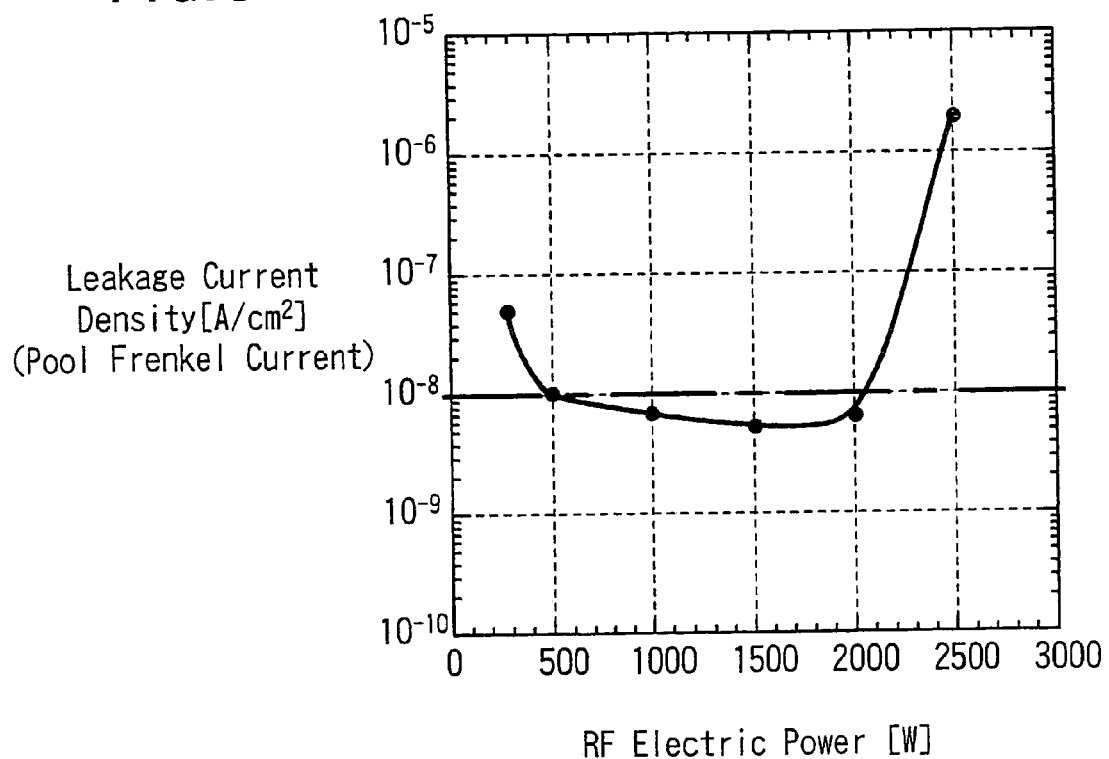
FIG. 8 is another characteristic graph showing the dependence of leakage current density relative to RF electric power and to which reference will be made in explaining a manufacturing method according to the present invention.

FIG. 8 is a characteristic graph showing the measured results of leakage current densities obtained when the RF electric power was changed in the oxidation process, i.e., the film quality improvement treatment. A study of the characteristic graph shown in FIG. 8 reveals that the film quality improvement effect is not sufficient when the RF electric power is less than 500 W. Moreover, from the characteristic graph shown in FIG. 8, it is to be understood similarly that the leakage current density rapidly increases when the RF electric power exceeds 2000 W. The reason for this is that the film is broken or partly crystallized. Therefore, the RF electric power in the film quality improvement treatment based upon oxidation process is selected to be greater than 500 W and less than 2000 W.

Figure 9:
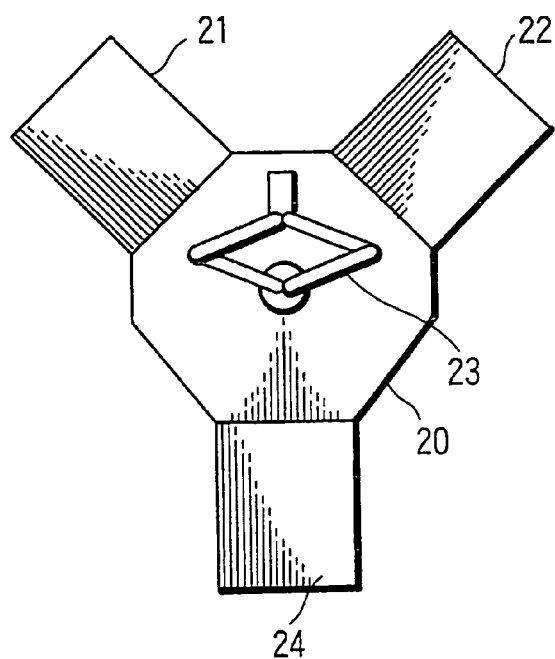
FIG. 9 is a schematic diagram showing an arrangement of an example of a single wafer film-deposition system.

In this inventive example, the treatment system for effecting the film-deposition process and the film quality improvement treatment process are not limited to the above-mentioned systems and may be variously modified. FIG. 9 is a schematic diagram showing an arrangement of such a modified treatment system. As shown in FIG. 9, this treatment system includes a substrate transportation chamber 20, which is provided with first and second chambers 21 and 22 and in which deposited substrates supplied from a load-lock chamber 24 in which substrate cassettes are disposed can be treated independently by the film-deposition treatment and the oxidation treatment of the film quality improvement treatment in the first and second chambers 21 and 22.

SECOND INVENTIVE EXAMPLE

In this inventive example, as shown in the aforementioned flowchart shown in FIG. 4, the repeated work that consists of a plurality of film-deposition treatments and the oxidation treatment of the film improvement treatment effected after each film-deposition treatment is carried out. According to this repeated work, sufficiently excellent film quality can be improved highly efficiently from a time standpoint.

Figure 10:
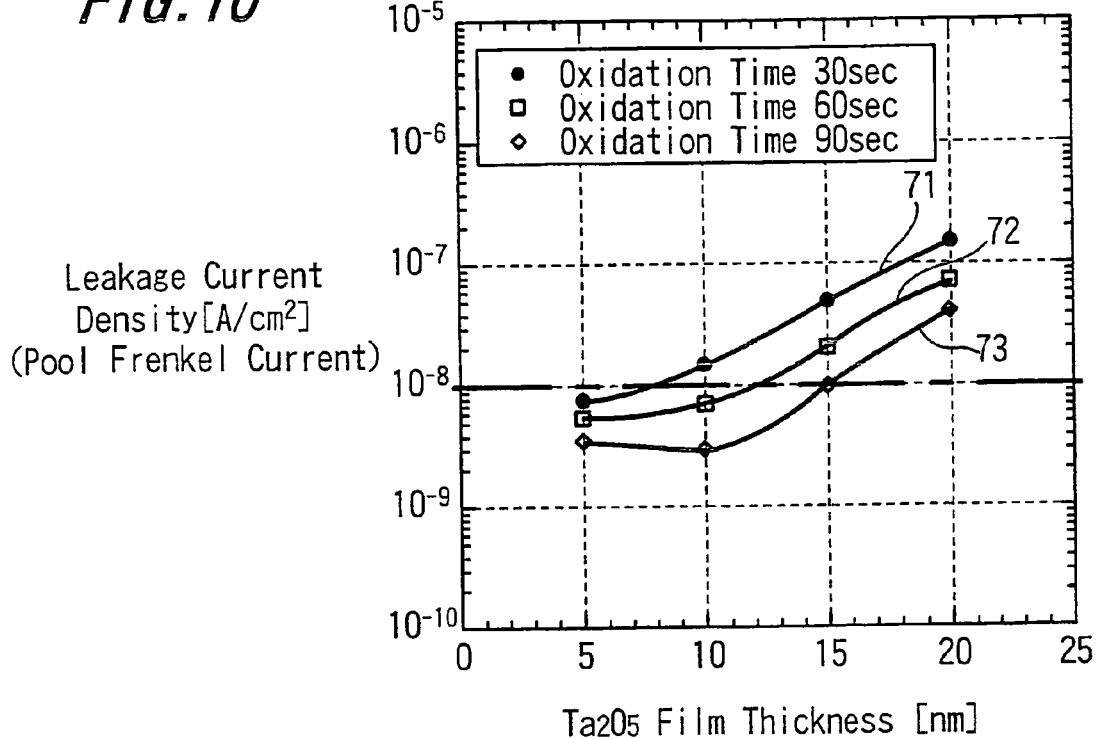
FIG. 10 is a characteristic graph showing measured results of the dependence of leakage current density relative to a film thickness of a tantalum oxide film obtained when oxidation time is changed and to which reference will be made in explaining the present invention.

FIG. 10 is a characteristic graph showing measured results of film thickness versus leakage current density obtained when the film thickness of the deposited film, i.e., the film thickness of the deposited tantalum oxide ($Ta_2O_5$) film, is varied and the oxidation treatment time of the film quality improvement is used as a parameter. In FIG. 10, characteristic curves 71, 72, 73 show measured results obtained when the time periods of the oxidation treatment time are selected to be 30 seconds, 60 seconds and 90 seconds, respectively.

The leakage current density shown in FIGS. 7, 8 and 10 is a current density obtained at a point in which a leakage current rapidly increases in accordance with an increase of an applied voltage, i.e., leakage current begins to move to a so-called Pool Frenkel current region.

From the measured results shown in FIG. 10, it is to be understood that when the film thickness increases in excess of 15 nm, a suppressing effect ratio of a leakage current relative to an oxidation time is lowered depending upon a treatment time.

Therefore, in this inventive example, when an amorphous metal oxide film having a film thickness larger than 15 nm is deposited, as shown in the flowchart shown in FIG. 4, the repeated work consisting of a plurality of film-deposition processes of a film thickness less than 15 nm and the oxidation treatment process of the film quality improvement effected after each film-deposition treatment has been carried out.

When an amorphous metal oxide film having a film thickness larger than 15 nm, for example, is deposited, it is very effective that the film-deposition treatment for depositing an amorphous metal oxide film having a film thickness less than 15 m and the oxidation treatment should be repeated integral multiple times. For example, when an amorphous metal oxide film having a film thickness of 30 m is deposited, a cycle of a film-deposition process having a film thickness of 10 nm and an oxidation treatment process are repeated three times with the result that a film thickness of 30 nm may be obtained.

According to this inventive example, a sufficient film thickness can be obtained highly efficiently from a time standpoint.

While the film-deposition process and the film-quality improvement treatment process can be carried out separately in the different chambers according to the above-mentioned inventive examples, in this case, a time required to transport the substrates 5 into the different chambers and to return the substrates 5 from the different chambers causes a loss of time in the working hours.

In particular, when an amorphous metal oxide film having a film thickness larger than 15 nm is deposited as described above, a work for repeatedly transporting the substrates 5 into the different chambers and returning the substrates 5 from the different chambers becomes necessary. As a result, this loss of time in the working hours becomes remarkable to degrade productivity.

THIRD INVENTIVE EXAMPLE

In this inventive example, as shown in the flowchart of FIG. 5, the film-deposition treatment and the oxidation treatment are continuously carried out within the same reaction chamber.

This inventive example is a film-deposition process that consists of a film-deposition process using a high-density plasma generation source such as a helicon plasma generation source and a film-quality improvement treatment.

Specifically, according to the aforementioned diode parallel plate plasma CVD system using the shower head, plasma that can be generated is too low in density to provide a practical film quality and a practical process.

This will be described below with reference to the flowchart of FIG. 12. In the flowchart shown in FIG. 12, steps identical to those of the flowcharts of FIGS. 4 and 5 are marked by the same reference numerals and therefore need not be described in detail.

Figure 12:
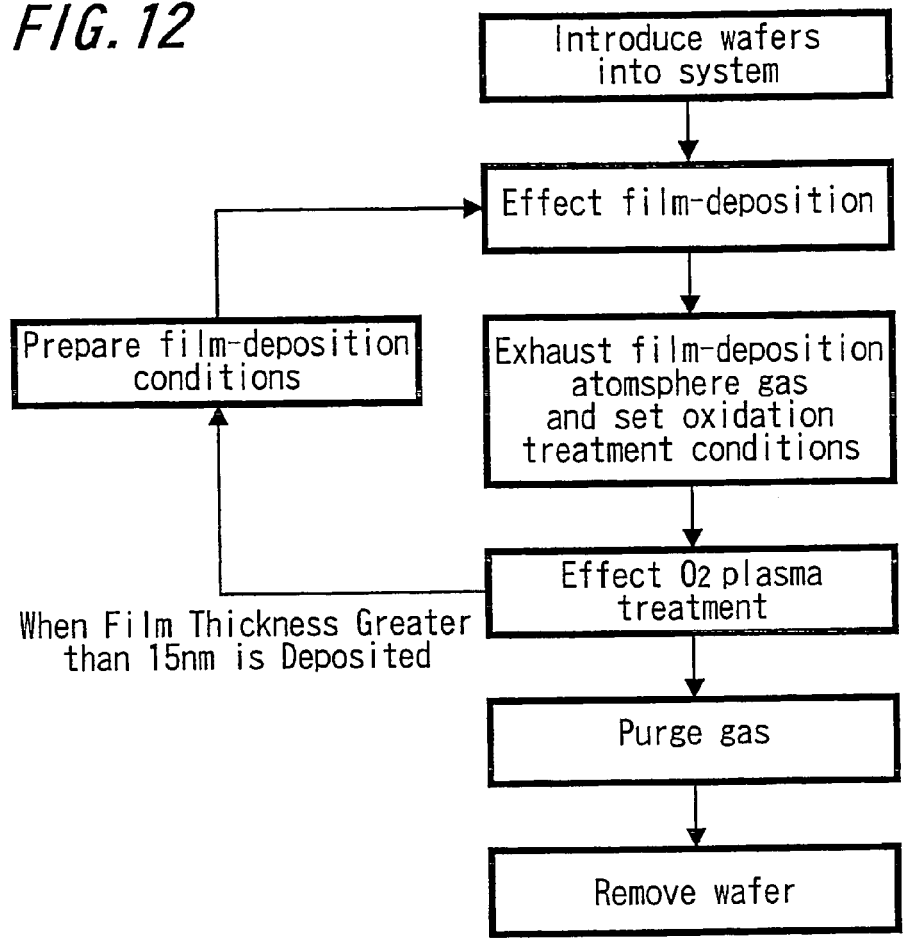
FIG. 12 is a flowchart to which reference will be made in explaining a method of depositing an amorphous tantalum oxide thin film in a manufacturing method according to the present invention.

As shown in the flowchart of FIG. 12, the steps required until the film-deposition is finished include a step in which the film-deposition residual atmosphere is exhausted and the oxidation condition is arranged at step S30 after the film-deposition process has been ended at step S21 similarly to the aforementioned first and second inventive examples. Thereafter, the oxidation step, i.e., $O_2$ plasma treatment, is carried out at step S22.

Then, at the stage in which this oxidation step has been ended, if a target film thickness is less than 15 mm, then a film-deposition process of an amorphous metal oxide film, i.e., an amorphous tantalum oxide film, is completed. When this film-deposition process is completed, in actual practice, gas is purged from the reaction chamber at step S31, whereafter the substrate is removed from the reaction chamber at step S23.

If a target film thickness is greater than 15 nm, as shown in the flowchart of FIG. 12, then in order to execute the aforementioned second film-deposition process, there is provided in advance a film-deposition condition preparation process for arranging the film-deposition conditions at step S32. Then, the film-deposition process is carried out at step S21. Further, conditions of the film-quality improvement treatment process based upon exhaustion of film-deposition atmosphere and O₂ plasma treatment are set, i.e., the preparation process is executed at the step S32, and the O₂ plasma treatment is executed at step S22. This work is repeated until a target film thickness may be obtained. Thereafter, gas is purged from the reaction chamber at step S31 and then the substrates are taken out from the reaction chamber at S23.

All film-deposition processes and all film-quality improvement treatment processes in the above-mentioned inventive examples are carried out in the regions in which the temperature is held under 430° C. This is because the assignee of the present application has discovered that film quality is degraded when the temperature in the region exceeds 430° C. Specifically, when a temperature region exceeds 430° C. this temperature region moves to a temperature zone in which a film-deposition reaction is started by thermal reaction. If plasma energy is applied to such temperature zone, then excess plasma energy is applied to such temperature zone. As a result, the raw material is caused to decompose excessively and the reaction is accelerated beyond necessity with the result that surplus reactants or unnecessary elements are easily mixed into the film. Thus, film quality is unavoidably deteriorated.

The conditions for depositing the amorphous metal oxide film and the oxidation treatment conditions of the film quality improvement treatment in the inventive examples of the present invention will be illustrated below.

INVENTIVE EXAMPLE

Film-Deposition Conditions:

| pentaethoxytantalum partial pressure | 1.7 mTorr |
| Oxygen partial pressure | 4.2 mTorr RF |
| electric power | 100 W |
| Temperature | 300° C. |

Oxidation Conditions:

| Oxygen partial pressure | 8 mTorr RF |
| electric power | 1500 W |
| Temperature | 300° C. |

Figure 11:
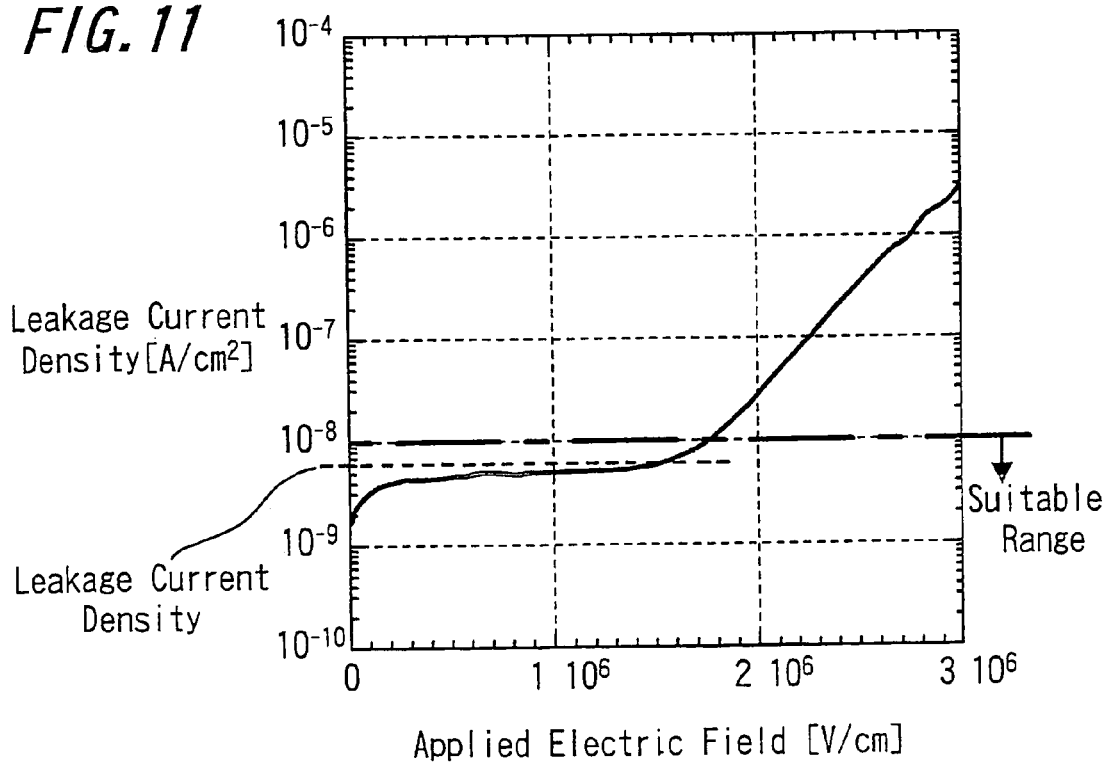
FIG. 11 is a characteristic graph showing leakage current density relative to applied electric field and to which reference will be made in explaining definition of leakage current density.

Then, in the electrical characteristic of the amorphous metal oxide film obtained by the methods of the present invention, it is desired that a leakage current value should be approximately less than $1\times10^{-8}$ [A/cm²] as shown by a dashed line in FIG. 11.

The film-deposition conditions and the oxidation conditions under which such electrical characteristic and homogeneity of the film thickness can be obtained are selected as follows.

Film-Deposition Conditions:

| pentaethoxytantalum partial pressure | 0.15 to 4.3 mTorr |
| Oxygen partial pressure | 0.7 to 8.6 mTorr RF |
| electric power | 40 to 200 W |
| Temperature | 100 to 430° C. |

Oxidation Conditions:

| Oxygen partial pressure | 5 to 15 mTorr RF |
| electric power | 500 to 2000 W |
| Temperature | 100 to 430° C. |

As described above, according to the present invention, the amorphous metal oxide film, e.g., the amorphous tantalum oxide film, which is excellent in film quality and leakage current characteristics, and, accordingly, which is highly reliable, can be made sufficiently thin.

Then, in the method of manufacturing a capacitance element according to the present invention, when the dielectric insulation layer that is interposed between the upper and lower electrode layers in a suitable structure, such as an MIM structure, is deposited, the same process as that of the aforementioned method of manufacturing the amorphous metal oxide film according to the present invention can be applied to such film-deposition process.

In the method of manufacturing a semiconductor device according to the present invention, when the dielectric layer or the insulation layer or the capacitance element in the circuit element is composed, the same process as that of the aforementioned method of manufacturing the amorphous metal oxide film according to the present invention can be applied to the above-mentioned method.

Figure 13:
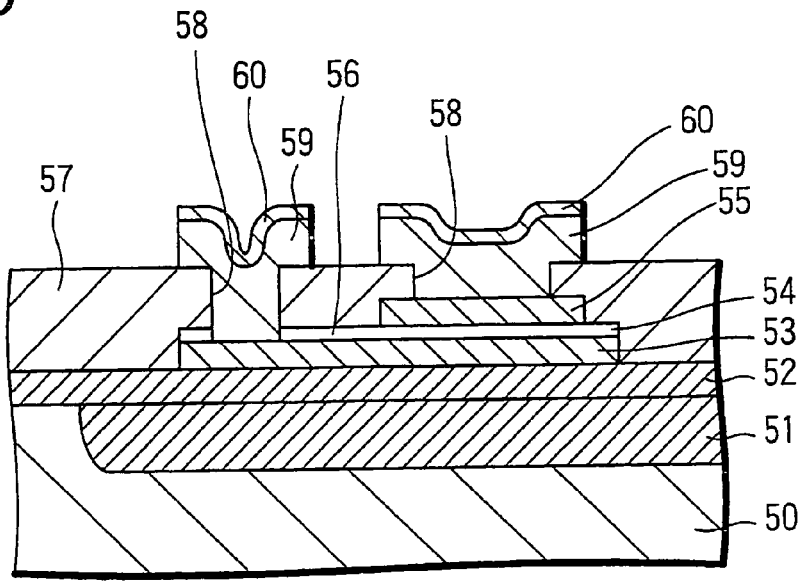
FIG. 13 is a schematic cross-sectional view showing a semiconductor device having a capacitance element obtained by a manufacturing method according to the present invention.

FIG. 13 is a schematic cross-sectional view showing an example of an MIM capacitance element serving as one circuit element in a semiconductor integrated circuit device to which the present invention is applied, for example.

In this example, as shown in FIG. 13, a local thermal oxidation film, i.e., a separation insulation layer 51 based upon LOCOS (Local Oxidation of Silicon) process, is deposited between circuit elements on the surface of a semiconductor substrate 50 comprising a semiconductor integrated circuit, e.g., a Si semiconductor substrate. An interlayer insulation layer 52 is deposited on the separation insulation layer 51.

A lower electrode layer 53 comprising the MIM capacitance element is deposited on this interlayer insulation layer 52, and a dielectric insulation layer 54 formed of the amorphous metal oxide film according to the present invention is deposited on the lower electrode layer 53. An upper metal electrode layer 55 is deposited on the dielectric insulation layer 54 at its position opposing the lower metal electrode layer 53. In this manner, there is fabricated an MIM capacitance element 56 in which an electrostatic capacity is formed between the lower metal electrode layer 53 and the upper metal electrode layer 55.

Then, an insulation layer 57 such as an SiO₂ layer is deposited on the whole surface, and contact through-holes 58 and 59 are bored through the two terminals opposing this capacitance element 56, i.e., the lower metal electrode layer 54 and the upper metal electrode layer 55. As shown in FIG. 13, the contact through-hole 58 is extended through the dielectric insulation layer 53 so as to reach the lower metal electrode layer 54.

Through the contact through-holes 58 and 59, there is deposited an interconnection layer 59 having a predetermined pattern formed of an Al alloy layer in which a protective film 60 made of TiN is formed on the surface.

This capacitance element can be formed simultaneously while other circuit elements are being formed.

The capacitance element and semiconductor device thus manufactured are highly reliable and are excellent in electrical characteristics.

According to the aforementioned methods of manufacturing the amorphous metal oxide film, e.g., an amorphous tantalum oxide film, and the capacitance element having the amorphous metal oxide film and the semiconductor device, all treatments can be carried out at low temperature, to be concrete, under 430° C. whereby a low-melting point metal layer excellent in workability and which is low in resistivity can be used as a conductive layer in a suitable assembly, such as the lower layer electrode and the interconnection.

Therefore, materials can be selected with increased freedom and metal, WN, TiN such as Al and Cu, which are inexpensive and excellent in workability, which can be formed as a microminiaturized pattern and which are low in resistivity can be used as a suitable assembly, such as the lower layer electrode and the interconnection.

Further, since highly-reliable amorphous metal oxide film having excellent characteristics, e.g., amorphous tantalum oxide film, can be formed as a dielectric insulation layer, it becomes possible to form a sufficiently thin dielectric insulation layer. Moreover, since the metal layer that is excellent in workability can be used as the aforementioned electrode and interconnection, the capacitance element can be microminiaturized more. Thus, the circuit element in the semiconductor integrated circuit device can be increased in density and the MIM structure can be realized so that the circuit element can be operated at higher speed.

Furthermore, since the film-deposition process and the film quality improvement treatment process can be carried out within the same reaction chamber, from an industry standpoint, there can be brought about many benefits, i.e., the system can be simplified in structure, can be handled with ease, and can be improved in workability, reliability and productivity. Hence, manufacturing costs can be reduced.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing an amorphous metal oxide film comprising:
    a process for depositing an amorphous metal oxide film; and
    a film treatment process for improving film quality of said amorphous metal oxide film in the state in which an amorphous state of said amorphous metal oxide film is maintained by a high-density plasma radiation treatment based upon ion and radical reactions and which contains at least oxygen at an ion current density higher than 5 mA/cm$^2$,
    wherein said process for depositing said amorphous metal oxide film is a film-deposition process using a source of said high-density plasma radiation and which is mainly composed of radical reaction and plasma electric power required in said film-deposition process selected to be higher than 40 W and less than 200 W,
    wherein all of said film-deposition processes and said film treatment processes of said amorphous metal oxide film are carried out at a temperature under 430° C., and
    wherein a leakage current value is less than $1 \times 10^{-8}$ A/cm$^2$.

2. A method of manufacturing an amorphous metal oxide film according to claim 1, wherein said film-deposition process and said film treatment process are carried out within the same reaction chamber.

3. A method of manufacturing an amorphous metal oxide film according to claim 1, wherein said film-deposition process is carried out a plurality of times in the state in which a film thickness of said amorphous metal oxide film is selected to be less than 15 nm and each said film treatment process is carried out after each said film-deposition process.

4. A method of manufacturing an amorphous metal oxide film according to claim 1, wherein when a target film thickness of said amorphous metal oxide film is greater than 15 nm, said film-deposition process is carried out a plurality of times in the state in which a film thickness of said amorphous metal oxide film is less than 15 nm and each said film treatment process is carried out after each said film-deposition process so that a total film thickness of said amorphous metal oxide film reaches a target film thickness greater than 15 nm.

5. A method of manufacturing an amorphous metal oxide film according to claim 1, wherein said amorphous metal oxide film is an amorphous tantalum oxide thin film.

6. In a method of manufacturing a capacitance element including an amorphous metal oxide film in which an amorphous metal oxide film is used as a capacitance insulation film, a method of manufacturing a capacitance element having an amorphous metal oxide film comprising:
    a film deposition process for depositing said amorphous metal oxide film; and
    a film treatment process for improving film quality of said amorphous metal oxide film in the state in which an amorphous state of said amorphous metal oxide film is maintained by a high-density plasma radiation treatment based upon ion and radical reactions and which contains at least oxygen at an ion current density higher than 5 mA/cm$^2$,
    wherein said process for depositing said amorphous metal oxide film is a film-deposition process using a source of said high-density plasma radiation and which is mainly composed of radical reaction and plasma electric power required in said film-deposition process selected to be higher than 40 W and less than 200 W,
    wherein all of said film-deposition processes and said film treatment processes of said amorphous metal oxide film are carried out at a temperature under 430° C., and
    wherein a leakage current value is less than $1 \times 10^{-8}$ A/cm$^2$.

7. A method of manufacturing a capacitance element having an amorphous metal oxide film according to claim 6, wherein said amorphous metal oxide film film-deposition process is a film-deposition process using said high-density plasma source and which is mainly composed of radical reaction and plasma electric power of said film-deposition process selected to be greater than 40 W and smaller than 200 W.

8. A method of manufacturing a capacitance element having an amorphous metal oxide film according to claim 6, wherein said film-deposition process and said film treatment process are carried out within the same reaction chamber.

9. A method of manufacturing a capacitance element having an amorphous metal oxide film according to claim 6, wherein said film-deposition process is carried out a plurality of times in the state in which a film thickness of said amorphous metal oxide film is selected to be less than 15 nm and each said film treatment process is carried out after each said film-deposition process.

10. A method of manufacturing a capacitance element having an amorphous metal oxide film according to claim 6, wherein when a target film thickness of said amorphous metal oxide film is greater than 15 nm, said film-deposition process is carried out a plurality of times in the state in which a film thickness of said amorphous metal oxide film is less than 15 nm and each said film treatment process is carried out after each said film-deposition process so that a total film thickness of said amorphous metal oxide film reaches a target film thickness greater than 15 nm.

11. A method of manufacturing a capacitance element having an amorphous metal oxide film according to claim 6, wherein said amorphous metal oxide film is an amorphous tantalum oxide thin film.

12. In a method of manufacturing a semiconductor device having an amorphous metal oxide film, a method of manufacturing a semiconductor device having an amorphous metal oxide film comprising:
a process for depositing an amorphous metal oxide film; and
a film treatment process for improving film quality of said amorphous metal oxide film in the state in which an amorphous state of said amorphous metal oxide film is maintained by a high-density plasma radiation treatment based upon ion and radical reactions and which contains at least oxygen at an ion current density higher than 5 mA/cm$^2$,
wherein said process for depositing said amorphous metal oxide film is a film-deposition process using a source of said high-density plasma radiation and which is mainly composed of radical reaction and plasma electric power required in said film-deposition process selected to be higher than 40 W and less than 200 W, and
wherein all of said film-deposition processes and said film treatment processes of said amorphous metal oxide film are carried out at a temperature under 430° C.,
wherein a leakage current value is less than $1 \times 10^{-8}$ A/cm$^2$.

13. A method of manufacturing a semiconductor device having an amorphous metal oxide film according to claim 12, wherein said process for depositing said amorphous metal oxide film is a film-deposition process using a source of said high-density plasma radiation and which is mainly composed of radical reaction and plasma electric power required in said film-deposition process and selected to be higher than 40 W and less than 200 W.

14. A method of manufacturing a semiconductor device having an amorphous metal oxide film according to claim 12, wherein said film-deposition process and said film quality improvement treatment process are carried out within the same reaction chamber.

15. A method of manufacturing a semiconductor device having an amorphous metal oxide film according to claim 12, wherein said film-deposition process is carried out a plurality of times in the state in which a film thickness of said amorphous metal oxide film is selected to be less than 15 nm and each said film treatment process is carried out after each said film-deposition process.

16. A method of manufacturing a semiconductor device having an amorphous metal oxide film according to claim 12, wherein when a target film thickness of said amorphous metal oxide film is greater than 15 nm, said film-deposition process is carried out a plurality of times in the state in which a film thickness of said amorphous metal oxide film is less than 15 nm and each said film treatment process is carried out after each said film-deposition process so that a total film thickness of said amorphous metal oxide film reaches a target film thickness greater than 15 nm.

17. A method of manufacturing a semiconductor device having an amorphous metal oxide film according to claim 12, wherein said amorphous metal oxide film is an amorphous tantalum oxide thin film.

* * * * *